United States Patent
Campardo et al.

(10) Patent No.: US 11,462,269 B2
(45) Date of Patent: Oct. 4, 2022

(54) PHASE CHANGE MEMORY DEVICE AND METHOD OF PROGRAMMING A PHASE CHANGE MEMORY DEVICE

(71) Applicant: STMicroelectronics S.r.l., Agrate Brianza (IT)

(72) Inventors: Giovanni Campardo, Bergamo (IT); Massimo Borghi, Varese (IT); Paola Zuliani, Milan (IT); Marco Barboni, Cambiago (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 32 days.

(21) Appl. No.: 17/099,257

(22) Filed: Nov. 16, 2020

(65) Prior Publication Data
US 2021/0166757 A1    Jun. 3, 2021

(30) Foreign Application Priority Data
Nov. 19, 2019   (IT) .................. 102019000021606

(51) Int. Cl.
*G11C 11/00* (2006.01)
*G11C 13/00* (2006.01)
*H01L 45/00* (2006.01)

(52) U.S. Cl.
CPC ...... *G11C 13/0069* (2013.01); *G11C 13/0004* (2013.01); *G11C 13/0023* (2013.01); *H01L 45/065* (2013.01)

(58) Field of Classification Search
CPC ............ G11C 13/0069; G11C 13/0004; G11C 13/0023; G11C 13/065
USPC .......................................................... 365/148
See application file for complete search history.

(56) References Cited

U.S. PATENT DOCUMENTS

| | | | |
|---|---|---|---|
| 5,825,046 A | 10/1998 | Czubatyj et al. | |
| 8,331,128 B1 | 12/2012 | Derhacobian et al. | |
| 10,872,664 B1 * | 12/2020 | Wu | G11C 11/5678 |
| 2005/0117387 A1 | 6/2005 | Hwang et al. | |
| 2005/0117389 A1 | 6/2005 | Worledge | |
| 2005/0237820 A1 | 10/2005 | Takemura et al. | |
| 2007/0077699 A1 | 4/2007 | Gordon et al. | |
| 2009/0067229 A1 | 3/2009 | Kang et al. | |
| 2009/0080242 A1 | 3/2009 | Resta et al. | |
| 2009/0201721 A1 | 8/2009 | Ha et al. | |
| 2010/0284212 A1 | 11/2010 | Bedeschi et al. | |
| 2010/0321989 A1 | 12/2010 | Lee | |
| 2011/0122687 A1 | 5/2011 | Kwon et al. | |

(Continued)

FOREIGN PATENT DOCUMENTS

| | | |
|---|---|---|
| EP | 1729303 A1 | 12/2006 |
| EP | 2034536 A1 | 3/2009 |

*Primary Examiner* — Vu A Le
(74) *Attorney, Agent, or Firm* — Slater Matsil, LLP (57) ABSTRACT

An embodiment phase-change memory device includes a memory array provided with a plurality of phase-change memory cells, each having a body made of phase-change material and a first state, in which the phase-change material is completely in an amorphous phase, and at least one second state, in which the phase-change material is partially in the amorphous phase and partially in a crystalline phase. A programming-pulse generator applies to the memory cells rectangular dynamic-programming pulses having an amplitude and a duration calibrated for switching the memory cells from the first state to the second state.

22 Claims, 4 Drawing Sheets

(56) References Cited

U.S. PATENT DOCUMENTS

2014/0064010 A1\* 3/2014 Barkley ............... G11C 13/004
                                                                365/226
2016/0372187 A1\* 12/2016 Papandreou ......... G11C 13/004

\* cited by examiner

PHASE CHANGE MEMORY DEVICE AND METHOD OF PROGRAMMING A PHASE CHANGE MEMORY DEVICE

CROSS-REFERENCE TO RELATED APPLICATIONS

This application claims the benefit of Italian Application No. 102019000021606, filed on Nov. 19, 2019, which application is hereby incorporated herein by reference.

TECHNICAL FIELD

The present invention relates to a phase-change memory device and to a method for programming a phase-change memory device.

BACKGROUND

As is known, the solid-state memory devices that are currently available differ considerably mainly as regards the capacity or incapacity to store data in a lasting manner even when they are not supplied (volatile and non-volatile memories) and as regards their performance, namely the reading and writing/programming access times. Volatile memories afford the maximum access speed for reading and modification, but their content cannot be preserved when the supply is removed. Instead, non-volatile memories are able to keep the data stored for very long periods and potentially indefinitely, without being supplied, but the access times may be of orders of magnitude longer than in volatile memories. Given the marked differences between one type of memory and the other, memory devices may be suited selectively to particular uses better than others. For instance, volatile memory cells are used for the internal registers of processing units, for cache memories, and, in general, for working memories since in all these cases priority is given to the access speed, which likewise varies from one application to another also according to the architecture and the size of the memory banks. Instead, non-volatile memories are used as mass memories, when priority is given to the storage capacity and to the conservation of the data in the absence of supply over the access speed.

SUMMARY

Each type of memory is, however, very rigid as regards its use, since the characteristics of each type of memory cannot be substantially altered. This is in contrast with the ever-increasing need for flexible solutions, which make it possible to provide optimized architectures according to the particular applications.

It is an object of the present invention to provide a phase-change memory device and a method for programming a phase-change memory device that will make it possible to overcome or at least mitigate the limitations described.

According to an embodiment of the present invention, a phase-change memory device comprises a memory array including a plurality of phase-change memory cells, each having a body made of phase-change material and a first state, in which the phase-change material is completely in an amorphous phase, and at least a second state, in which the phase-change material is partially in the amorphous phase and partially in a crystalline phase; and a programming-pulse generator, configured to apply to the memory cells rectangular dynamic-programming pulses having an amplitude and a duration calibrated for switching the memory cells from the first state to the second state.

Another embodiment provides a method for programming a phase-change memory device comprising a memory array including a plurality of phase-change memory cells, each having a body made of phase-change material and a first state, in which the phase-change material is in an amorphous phase, and at least a second state, in which the phase-change material is partially in the amorphous phase and partially in a crystalline phase. The method comprises applying to the memory cells rectangular dynamic-programming pulses having an amplitude and a duration calibrated for switching the memory cells from the first state to the second state.

BRIEF DESCRIPTION OF THE DRAWINGS

For a better understanding of the present invention, some embodiments thereof will now be described, purely by way of non-limiting example and with reference to the attached drawings, wherein.

DETAILED DESCRIPTION OF ILLUSTRATIVE EMBODIMENTS

Figure 1:
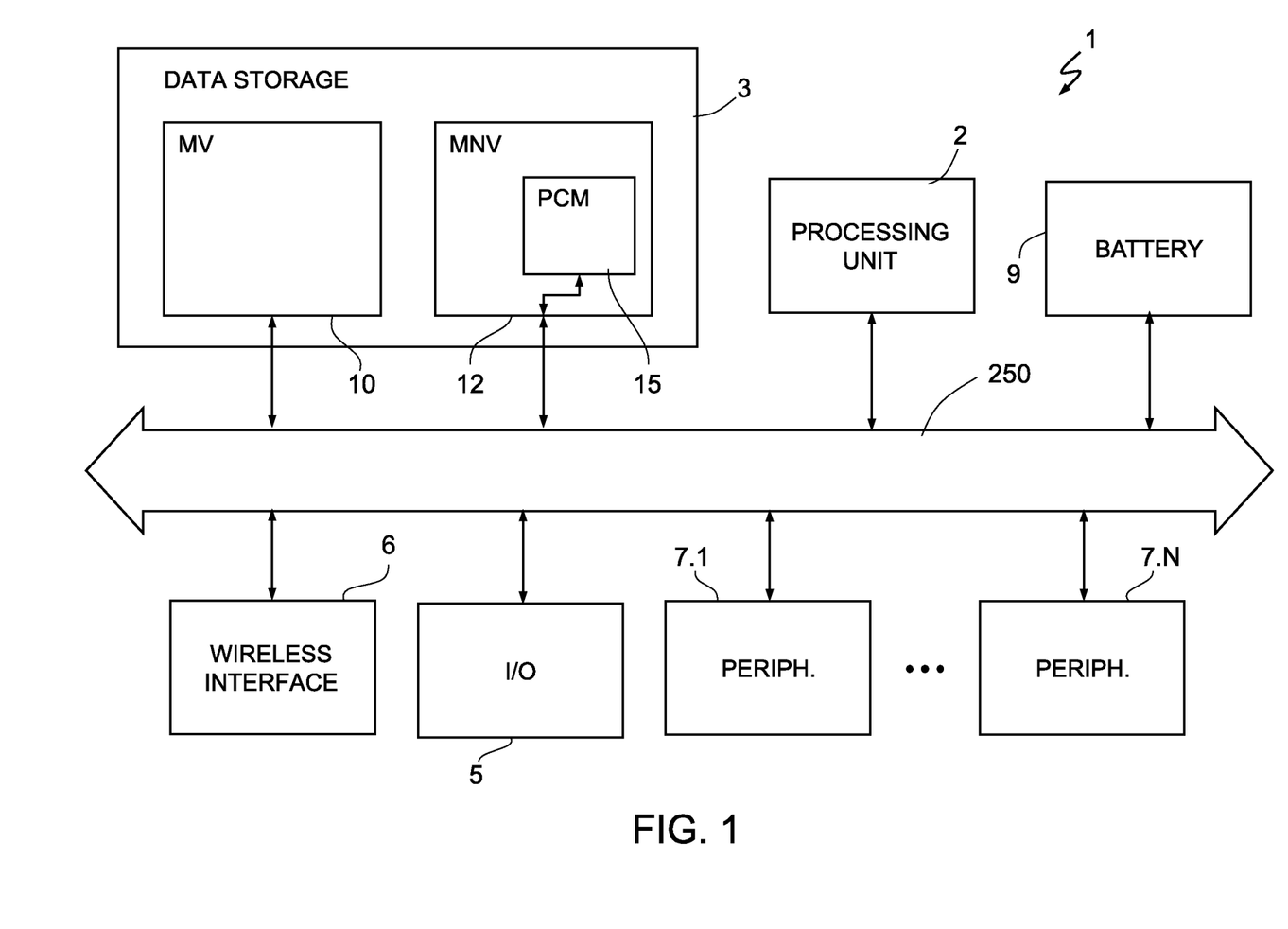
FIG. 1 is a simplified block diagram of an electronic system.

With reference to FIG. 1, an electronic system is designated as a whole by the reference number 1 and may be a computer of any type, for example a mainframe, a personal computer, a laptop, or a tablet, possibly with wireless-connection capacity, a smartphone, a messaging device, a digital music player, a digital camera, or other devices that are adapted to process, store, transmit, or receive information. The electronic system 1 may be a general-purpose computer system or a computer system embedded in a device, an apparatus, or a further system.

The electronic system 1 comprises a processing unit 2 and data-storage media 3 and may moreover be provided with input/output (I/O) devices 5 (for example, a keypad, a mouse, or a touchscreen), a wireless interface 6, peripherals 7.1, . . . , 7.N, and possibly further auxiliary devices, here not illustrated. The components of the electronic system 1 may be coupled in communication with one another directly and/or indirectly through a bus 8. The electronic system 1 may moreover comprise a battery 9. It should be noted that the scope of the present invention is not limited to embodiments that necessarily present one or all of the devices listed.

The processing unit 2 may comprise, for example, one or more microprocessors, microcontrollers, and the like, according to the design preferences.

The data-storage media 3 may comprise volatile-memory devices 10 and non-volatile-memory devices 12 of various kinds, for example SRAMs and/or DRAMs for volatile and solid-state memories, magnetic disks, and/or optical disks for non-volatile memories. In particular, the data-storage media 3 comprise a phase-change memory 15. Phase-change memories are based upon memory elements made of materials that have the property of switching between two phases that have distinct electrical characteristics, in particular values of resistivity that differ by approximately two orders of magnitude or more. Corresponding to the two phases are different crystallographic structures of the material constituting the memory element, and, consequently, different electrical characteristics. More precisely, a (disorderly) amorphous structure and a high value of resistivity correspond to a first phase, whereas an (orderly) crystalline (either monocrystalline or polycrystalline) structure and a low value of resistivity correspond to a second phase. Currently, alloys of elements of Group VI of the Periodic Table, also referred to as chalcogenides, are used successfully in phase-change memory cells. A widely used material is an alloy of Ge, Sb, and Te (GST). In chalcogenides, as has been mentioned, the resistivity varies by two or more orders of magnitude when the material passes from the amorphous phase, with higher resistivity, to the crystalline phase, with lower resistivity, and vice versa. Phase changes between an amorphous phase and a crystalline phase may be obtained by locally increasing the temperature. From the electrical standpoint, it is possible to reach the crystallisation and melting temperatures by causing a current to flow through a resistive element or heater that heats the chalcogenide by the Joule effect.

Figure 2:
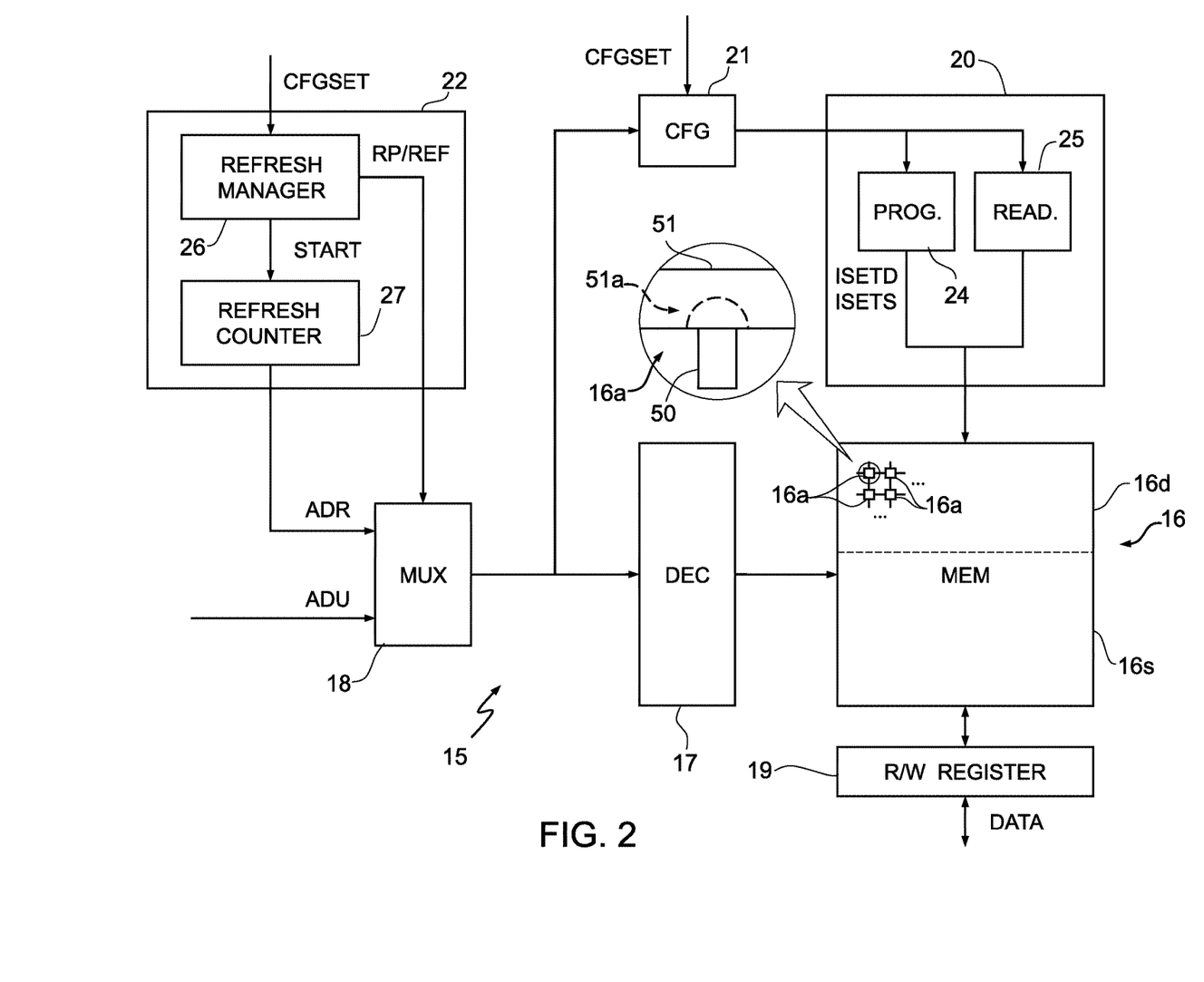
FIG. 2 is a more detailed block diagram of a phase-change memory device according to an embodiment of the present invention, incorporated in the electronic system of FIG. 1.

With reference to FIG. 2, the phase-change memory 15 comprises a memory array 16 having a plurality of phase-change memory cells 16a arranged in rows and columns, an address decoder 17, a multiplexer 18, a reading/programming register 19, a reading and programming circuit 20, a configuration circuit 21, and a refresh unit 22.

One of the memory cells 16a, which are all the same as one another, is illustrated schematically in the enlarged representation of FIG. 2 and comprises a heater 50 and a portion 51a of a memory layer 51 containing a chalcogenide, for example GST, in contact with the heater 50. The portion 51a of the memory layer 51 switches its state in response to programming currents that flow through the heater 50.

The memory cells 16a are selected for programming and/or reading operations by the address decoder 17, which, through the multiplexer 18, receive at input user addresses ADU from outside, in particular from the processing unit 2, or else refresh addresses ADR from the refresh unit 22, as explained hereinafter. The multiplexer 18 is controlled by the refresh unit 22.

The reading and programming circuit 20 comprises a programming-pulse generator 24 and a reading circuit 25. The data to be programmed and the data resulting from reading of the memory array 16 are loaded into the reading/programming register 19. The programming-pulse generator 24 and the reading circuit 2 present a first operating mode or dynamic operating mode (FIG. 3), where the memory cells 16a are read and switched between an amorphous reset state SRES and a dynamic-set state SSETD intermediate between the amorphous reset state SRES and a completely crystalline static-set state SSETS, and a second operating mode or static operating mode (FIG. 4), in which the memory cells 16a are read and switched between the amorphous reset state SRES and the completely crystalline static-set state SSETS. Here and in what follows, the expressions used to indicate that a memory cell 16a is in the reset state SRES, in the static-set state SSETS, or in the dynamic-set state SSETD, or else that a memory cell 16a switches from or to the reset state SRES, the static-set state SSETS, or the dynamic-set state SSETD are to be understood in the sense that the portion 51a of the memory layer 51 belonging to the memory cell 16a involved is in the reset state SRES, in the static-set state SSETS, or in the dynamic-set state SSETD, or else switches from or to the reset state SRES, the static-set state SSETS, or the dynamic-set state SSETD.

Figure 3:
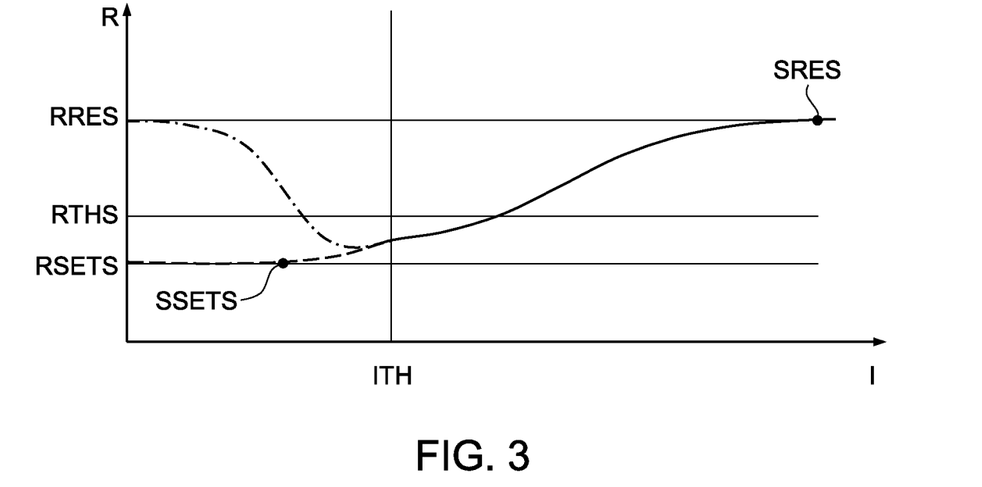
FIG. 3 is a graph that shows quantities regarding a memory cell of the phase-change memory device of FIG. 2 in a first operating mode.
Figure 4:
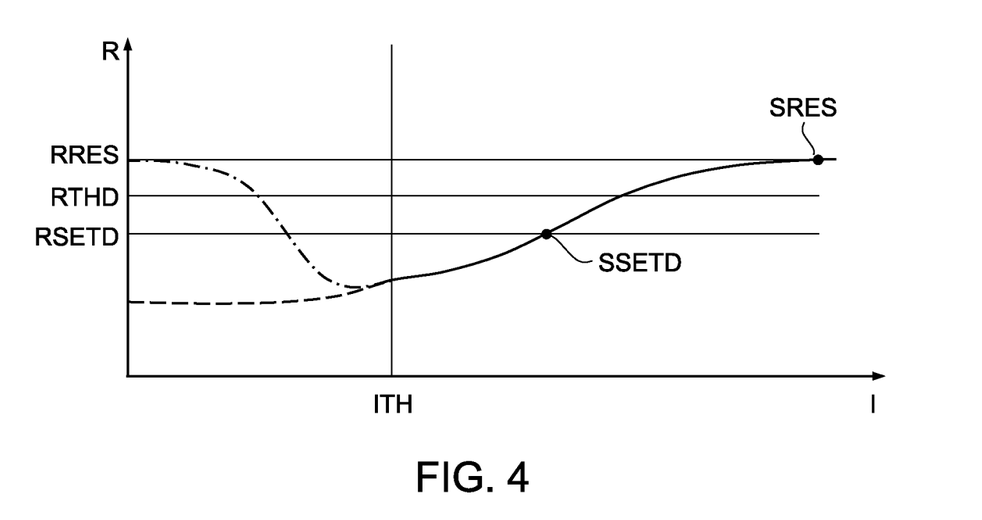
FIG. 4 is a graph that shows quantities regarding a memory cell of the phase-change memory device of FIG. 2 in a first operating mode.

FIGS. 3 and 4 show programming characteristics of the memory cells 16a, respectively in the dynamic operating mode and in the static operating mode, with the programming states SRES, SSETD, SSETS, a dynamic-reading threshold resistivity RTHD (FIG. 3) and a static-reading threshold resistivity RTHS (FIG. 4). More precisely, the characteristics of FIGS. 3 and 4 indicate the values of resistance of the memory cells 16a that are obtained after rectangular programming current pulses of fixed duration have been applied. Hence, given the duration and the rectangular shape of the programming current pulses, the final state of the memory cells 16a (i.e., the final value of resistance) is determined by the amplitude of the programming pulses and is substantially independent of the initial state, if the amplitude of the programming current pulses is greater than a threshold programming current ITH, for example 200 µA (solid line in FIGS. 3 and 4). For values of current lower than the threshold programming current ITH, instead, the final state also depends upon the initial state. By way of example, FIGS. 3 and 4 show the programming characteristics starting from the reset state SRES (dashed-and-dotted line) and starting from the static-set state SSETS (dashed line) for values of current lower than the threshold programming current ITH. The static-set state SSETS can be reached with a static-set pulse, for example of a trapezoidal shape, with a descending ramp that enables slow cooling and complete crystallisation of the chalcogenide, as described in greater detail hereinafter. As emerges from FIGS. 3 and 4, a resistance RSETD associated to the dynamic-set state SSETD is intermediate between a resistance RRES of the reset state SRES and a resistance RSETS of the static-set state SSETS. Moreover, the dynamic-set state SSETD, which is in any case chosen between the static-set state SSETS and the reset state SRES, may be obtained by programming current pulses having an amplitude greater than the threshold programming current ITH and hence in a way independent of the initial conditions of the memory cells 16a.

Figure 5A:
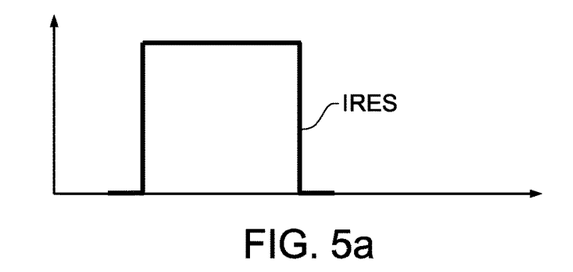
FIGS. 5a-5c are graphs that show respective electrical quantities used in the phase-change memory device of FIG. 2.
Figure 5B:
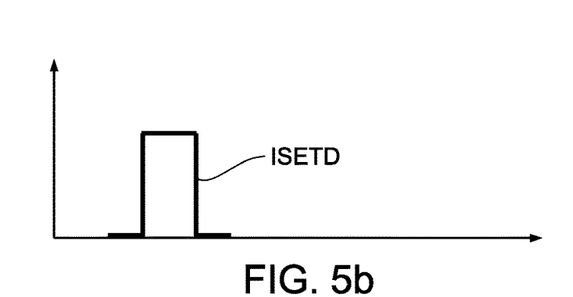
Figure 5C:
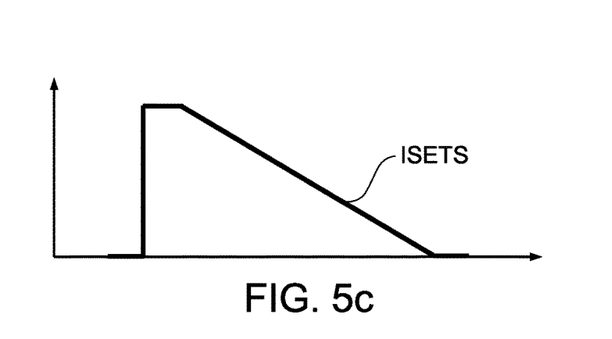

The programming-pulse generator 24 is configured to apply programming current pulses to memory cells 16a selected via the address decoder 17. In and embodiment, in particular, the programming current pulses comprise reset pulses IRES (FIG. 5a), first set pulses or dynamic-set pulses ISETD (FIG. 5b), and second set pulses or static-set pulses ISESTS (FIG. 5c).

The reset pulses IRES, having a rectangular shape, may be the same in the dynamic operating mode and in the static operating mode and have an amplitude and a duration such that memory cells 16a that receive a reset pulse IRES are brought into the amorphous reset state SRES. In practice, the reset pulses IRES cause complete melting of the chalcogenide of the memory cells 16a, and rapid cooling due to the rectangular shape brings the chalcogenide into the amorphous reset state SRES.

The dynamic-set pulses ISETD are used in the dynamic operating mode and have a rectangular shape, with leading edges and trailing edges substantially vertical or in any case with a duration of less than some tens of nanoseconds, for example 20 ns. The amplitude of the dynamic-set pulses ISETD is selected so that the portions 51a of the memory layer 51 that belong to the memory cells 16a involved melt only partially and are brought into the dynamic-set state SSETD. In particular, when a dynamic-set pulse ISETD is applied, the chalcogenide that forms the memory layer 51 melts only at the interface with the heater 50, where the temperature is higher. In the region surrounding the molten area (portion 51a of the memory layer 51), the chalcogenide reaches a temperature sufficient to favour a process of re-crystallisation by annealing and assumes a partially crystalline state, intermediate between the completely amorphous state and the completely crystalline state, which defines the dynamic-set state SSETD.

The static-set pulses ISETS are used in the static operating mode and have a trapezoidal or triangular shape. The amplitude of the static-set pulses ISETS is selected so that the portions 51a of the memory layer 51 that belong to the memory cells 16a involved melt completely. Moreover, the static-set pulses ISETS have trailing edges of a duration of some microseconds, for example 5 µs (hence some orders of magnitude more than the trailing edges of the dynamic-set pulses ISETD). In this way, slow cooling enables complete crystallisation of the chalcogenide.

The operating mode, whether dynamic or static, is determined by the configuration circuit 21 on the basis of configuration instructions CFGSET received from the processing unit 2 and of the address received through the multiplexer 18. The configuration instructions CFGSET identify address ranges, not necessarily consecutive, which correspond either to a first set of memory cells 16a to be used in the dynamic operating mode or to a second set of memory cells 16a to be used in the static operating mode. More precisely, the first set of memory cells 16a and the second set of memory cells 16a are not necessarily consecutive to one another, and each of the first set of memory cells 16a and the second set of memory cells 16a does not necessarily include exclusively memory cells 16a with consecutive addresses. The memory array 16 is in this way partitioned into a first section or dynamic section 16d, which comprises the memory cells 16a of the first set, and a second section or static section 16s. The partition can be re-set and modified by re-defining the addresses of the dynamic section 16d and of the static section 16s, both in the initialisation step and during run-time. Consequently, any memory cell 16a at different times may be used both in the dynamic operating mode and in the static operating mode.

The configuration circuit 21 selects the dynamic operating mode or the static operating mode and, consequently, requires the programming-pulse generator 24 to supply dynamic-set pulses ISETD or static-set pulses ISETS on the basis of the address received from the address decoder 17: if the address received corresponds to a memory cell 16a of the dynamic section 16d, the dynamic operating mode is selected, and dynamic-set pulses ISETD are used; if, instead, the address received corresponds to a memory cell 16a of the static section 16s, the static operating mode is selected, and static-set pulses ISETS are used.

Figure 6:
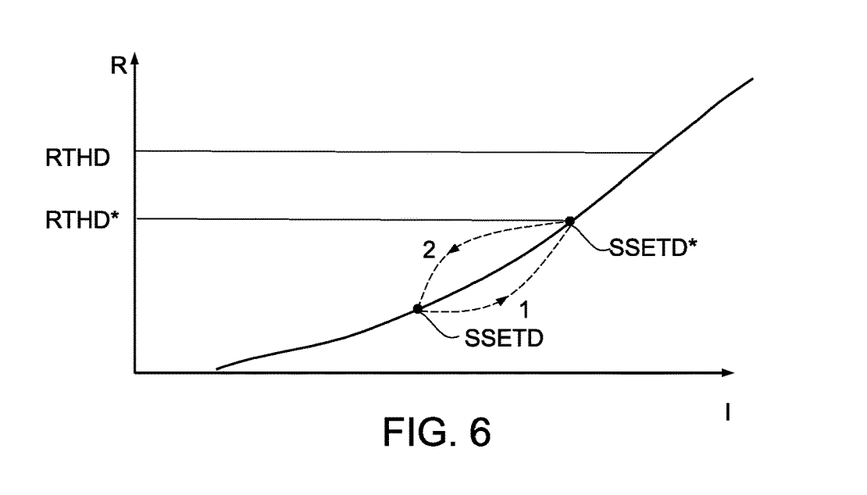
FIG. 6 shows an enlarged portion of the graph of FIG. 4.

The refresh unit 22 comprises a manager module 26 and a counter 27. The manager module 26 controls the multiplexer 18 by a selection signal RP/REF and the counter 27 by a refresh-activation signal START. When the selection signal RP/REF has a first logic value, the multiplexer 18 selects the user addresses ADU coming from outside. When, instead, the selection signal RP/REF has a second logic value, the multiplexer 18 selects the refresh addresses ADR supplied by the refresh unit 22, in particular by the counter 27. The manager module 26 sets the first value of the selection signal RP/REF during normal operation of the phase-change memory 15 and the second logic value in response to refresh conditions. The refresh conditions may be selected on the basis of the design preferences and may be based, by way of non-limiting example, upon an operating time interval starting from the last refresh, possibly corrected as a function of the temperature, or upon the outcome of a threshold reading that detects a drift of one of the memory cells 16a from the dynamic-set state SSETD towards the amorphous reset state SRES, so that the difference between the resistivity of the memory cell 16a and the dynamic-reading threshold resistivity RTHD is less than a safety margin. The dynamic-reading threshold resistivity RTHD is normally used during reading in order to discriminate between the partially crystalline state and the amorphous state of the memory cells 16a in the dynamic operating mode. The effect of the drift of the memory cells 16a from the dynamic-set state SSETD to the amorphous reset state SRES and of restoration of the dynamic-set state SSETD via refresh is illustrated in FIG. 6. The arrow identified by the number 1 indicates the drift from the dynamic-set state SSETD to a modified state SSETD*, having a progressively higher resistivity. When, for example by threshold reading, a modified resistance RSETD* higher than a critical threshold (not shown) is identified, the procedure for refreshing the corresponding memory cell 16a is activated. The refresh procedure restores the resistance RSETD associated to the dynamic-set state SSETD by a dynamic-set pulse ISETD (arrow 2 in FIG. 6).

With reference once again to FIG. 2, the counter 27 is activated by the refresh-activation signal START and supplies in sequence the refresh addresses ADR of the memory cells 16a of the dynamic section 16d of the memory array 16 to which the refresh procedure is to be applied. The refresh addresses ADR may be supplied in groups, for example in pages. The addresses of the memory cells 16a of the dynamic section 16d of the memory array 16 may be stored in the manager module 26 or in the counter 27 via the configuration instructions CFGSET. In the first case, the manager module 26 sets in the counter 27 start-of-count and end-of-count addresses for each set of memory cells 16a. In one embodiment, the addresses of the memory cells 16a of the dynamic section 16d may be read from the configuration circuit 21.

In an alternative embodiment, the refresh module 22 carries out a refresh of the entire memory array 16, regardless of possible partitions into dynamic sections 16d and static sections 16s. In this case, the counter 27 scans all the addresses of the memory array 16.

The procedure for programming into the dynamic-set state SSETD of the dynamic operating mode is considerably faster than the corresponding procedure for programming into the static-set state SSETS in the static operating mode. In fact, after a reset pulse IRES that is in any case applied to initialize each memory cell 16a to be programmed into the reset state SRES, programming into the dynamic-set state SSETD uses dynamic-set pulses ISETD, the trailing edges of which have a duration of the order of tens of nanoseconds. In the static operating mode, instead, static-set pulses ISETS are applied, the trailing edges of which have a duration of the order of microseconds to allow crystallisation of the chalcogenide. While the memory cells 16a of the static section 16s, which are in the static operating mode, can be used as conventional non-volatile cells, the memory cells 16a of the dynamic section 16d, which are in the dynamic operating mode, are suited to being used in numerous applications in which relatively short access times to the memory are desired, especially in the writing step. For instance, in many architectures, several levels of cache memory are used, the requisites of which in terms of access are certainly less stringent than those of volatile working memories (RAMs), but cannot in any case be satisfied by conventional non-volatile memories. The use of additional cache levels in complex architectures, as in some server applications, may enable optimization of data transfer between the working memories and the mass-memory devices, which are as a rule the slowest.

Some dormant systems that are designed to be particularly reactive to given external conditions may significantly improve their performance by loading the boot software directly into the static section 16d of the memory array 16 and using the dynamic section 16d as system RAM. Thanks to the high parallelism that may be achieved and the fast programming of the memory cells in the dynamic operating mode, the time for loading the boot software into the RAM is very short and hence the burden of the boot procedure is drastically downsized. The system has a high reactivity and is prompt in carrying out its own tasks (for example, as backup server, in power-mains management systems, etc.).

When the target is high computing performance, it is advantageous, on account of the high parallelism that can be achieved, to upload the code of the active processes into the static section 16s of the memory array 16 by transferring it en bloc from mass-storage devices. This is the case, for example, of data-processing centres. The average latency time in accessing data for each process being executed drops considerably.

The invention may advantageously be used for implementing functions of dynamic backup of the processed data. For instance, a computing server is normally provided with large amounts of volatile working memory (RAM), which during operation contains proportionally large amounts of data. These data, which are potentially sensitive data, may get lost in the event of sudden power cuts or system malfunctioning. Use of the phase-change memory in the dynamic operating mode enables, thanks to the programming speed, execution of frequent backups and hence limitation of damage in the case of untoward events.

Another advantage is the flexibility of use, thanks to the fact that the memory array may be partitioned into dynamic sections and static sections by simple configuration instructions that define the addresses of each section. The partitions may also be modified in run-time and not only in the initialisation stage.

Finally, it is evident that modifications and variations may be made to the device and method described herein, without thereby departing from the scope of the present invention, as defined in the annexed claims.

For instance, in some applications it might be sufficient to use the phase-change memory only in the dynamic mode. In this case, the memory array can be without partitions, and the programming-pulse generator can be configured to supply set pulses of just the dynamic type.

What is claimed is:

1. A phase-change memory device comprising:
a memory array including a plurality of phase-change memory cells, each memory cell having:
a body of phase-change material,
a first state, in which the phase-change material is completely in an amorphous phase,
a second state, in which the phase-change material is partially in the amorphous phase and partially in a crystalline phase, and
a third state, in which the phase-change material is completely in the crystalline phase;
a configuration circuit, configured to:
define a first section of the memory array, containing a first set of the memory cells to be used in a first operating mode; and
define a second section of the memory array, containing a second set of the memory cells to be used in a second operating mode; and
a programming-pulse generator, configured to:
apply dynamic-programming pulses to switch the memory cells in the first section from the first state to the second state in the first operating mode, and
apply static-programming pulses to switch the memory cells in the second section from the first state to the third state in the second operating mode.

2. The device according to claim 1, wherein the dynamic-programming pulses have a rectangular shape, a first amplitude, and a first duration calibrated to switch the memory cells in the first section from the first state to the second state in the first operating mode, and the static-programming pulses have a second amplitude, a second duration, and sloped trailing edges calibrated to switch the memory cells from the first state to the third state in the second operating mode.

3. The device according to claim 2,
wherein the first section and the second section are identified by respective memory addresses.

4. The device according to claim 3, further comprising an address decoder,
wherein the address decoder is configured to:
receive addresses; and
select memory cells based on the received addresses; and
wherein the configuration circuit is configured to:
selectively control the programming-pulse generator in the first operating mode, in response to the received addresses corresponding to the memory cells in the first section; and
selectively control the programming-pulse generator in the second operating mode, in response to the received addresses corresponding to the memory cells in the second section.

5. The device according to claim 4, further comprising a refresh unit, configured to refresh the memory array in response to refresh conditions, wherein the received addresses comprise first addresses received from outside the device and second addresses supplied by the refresh unit.

6. The device according to claim 5, further comprising a multiplexer, configured to:
receive the first addresses and the second addresses; and
selectively supply the first addresses or the second addresses to the address decoder.

7. The device according to claim 6, wherein the refresh unit is configured to control the multiplexer.

8. The device according to claim 6, wherein the refresh unit comprises:
a manager module configured to control the multiplexer by a selection signal, wherein the selection signal is configured to have a first logic value to control the multiplexer to select the first addresses, and wherein the selection signal is configured to have a second logic value to control the multiplexer to select the second addresses.

9. The device according to claim 8, wherein the manager module is configured to set the second logic value for the selection signal in response to the refresh conditions, and set the first logic value for the selection signal otherwise.

10. The device according to claim 8, wherein the refresh unit comprises a counter controlled by the manager module, and wherein the counter is configured to supply in sequence the second addresses of the first set of memory cells of the first section of the memory array.

11. The device according to claim 10, wherein the manager module is configured to activate the counter in response to the refresh conditions.

12. An electronic system comprising:
a processing unit; and
data-storage media communicatively coupled to the processing unit, wherein the data-storage media comprise a phase-change memory device comprising:
a memory array including a plurality of phase-change memory cells, each memory cell having:
a body of phase-change material,
a first state, in which the phase-change material is completely in an amorphous phase,
a second state, in which the phase-change material is partially in the amorphous phase and partially in a crystalline phase, and
a third state, in which the phase-change material is completely in the crystalline phase;
a configuration circuit, configured to:
define a first section of the memory array, containing a first set of the memory cells to be used in a first operating mode; and
define a second section of the memory array, containing a second set of the memory cells to be used in a second operating mode; and
a programming-pulse generator, configured to:
apply dynamic-programming pulses to switch the memory cells in the first section from the first state to the second state in the first operating mode, and
apply static-programming pulses to switch the memory cells in the second section from the first state to the third state in the second operating mode.

13. A method for programming a phase-change memory device, the phase-change memory device comprising a memory array including a plurality of phase-change memory cells, each memory cell having a body made of phase-change material, a first state, in which the phase-change material is in an amorphous phase, a second state, in which the phase-change material is partially in the amorphous phase and partially in a crystalline phase, and a third state, in which the phase-change material is completely in the crystalline phase, the method comprising:
defining, by a configuration circuit, a first section of the memory array, containing a first set of the memory cells to be used in a first operating mode;
defining, by the configuration circuit, a second section of the memory array, containing a second set of the memory cells to be used in a second operating mode;
applying, by a programming-pulse generator, dynamic-programming pulses for switching the memory cells in the first section from the first state to the second state in the first operating mode; and
applying, by the programming-pulse generator, static-programming pulses to switch the memory cells in the second section from the first state to the third state in the second operating mode.

14. The method according to claim 13, wherein
the dynamic-programming pulses have a rectangular shape, a first amplitude, and a first duration calibrated to switch the memory cells in the first section from the first state to the second state in the first operating mode, and the static-programming pulses have a second amplitude, a second duration, and sloped trailing edges calibrated for switching the memory cells from the first state to the third state in the second operating mode.

15. The method according to claim 14, further comprising:
identifying the first section and the second section by respective memory addresses.

16. The method according to claim 15, further comprising:
receiving, by an address decoder, addresses;
selecting, by the address decoder, memory cells based on the received addresses; and
selectively controlling, by the configuration circuit, the programming-pulse generator in the first operating mode, in response to the received addresses corresponding to the memory cells in the first section; or
selectively controlling, by the configuration circuit, the programming-pulse generator in the second operating mode, in response to the received addresses corresponding to the memory cells in the second section.

17. The method according to claim 16, further comprising:
refreshing, by a refresh unit, the memory array in response to refresh conditions, the received addresses comprising first addresses received from outside the device and second addresses supplied by the refresh unit.

18. The method according to claim 17, further comprising:
receiving, by a multiplexer, the first addresses and the second addresses; and
selectively supplying, by the multiplexer, the first addresses or the second addresses to the address decoder.

19. The method according to claim 18, further comprising:
controlling, by a manager module in the refresh unit, the multiplexer by a selection signal, the selection signal having a first logic value to control the multiplexer to select the first addresses, or the selection signal having a second logic value to control the multiplexer to select the second addresses.

20. The method according to claim 19, further comprising:
setting, by the manager module, the second logic value for the selection signal in response to the refresh conditions; or
setting, by the manager module, the first logic value for the selection signal otherwise.

21. The method according to claim 20, further comprising:
controlling, by the manager module, a counter in the refresh unit; and
supplying, by the counter, in sequence the second addresses of the first set of memory cells of the first section of the memory array.

22. The method according to claim 21, further comprising activating, by the manager module, the counter in response to the refresh conditions.

* * * * *